(12) United States Patent
Willer et al.

(10) Patent No.: US 6,525,363 B1
(45) Date of Patent: Feb. 25, 2003

(54) INTEGRATED CIRCUIT CONFIGURATION WITH AT LEAST ONE CAPACITOR AND METHOD FOR PRODUCING THE SAME

(75) Inventors: Josef Willer, Riemerling (DE); Bernhard Sell, Dresden (DE); Dirk Schumann, Dresden (DE)

(73) Assignee: Infineon Technologies AG, Munich (DE)

( * ) Notice: Subject to any disclaimer, the term of this patent is extended or adjusted under 35 U.S.C. 154(b) by 3 days.

(21) Appl. No.: 09/677,433

(22) Filed: Oct. 2, 2000

(30) Foreign Application Priority Data

Sep. 30, 1999 (DE) .......................................... 199 47 082

(51) Int. Cl.[7] ............................................ H01L 27/108
(52) U.S. Cl. ..................... 257/309; 257/306; 257/308; 438/255; 438/398
(58) Field of Search ................................. 257/306, 308, 257/309; 438/255, 398

(56) References Cited

U.S. PATENT DOCUMENTS

| 5,434,812 | A |   | 7/1995  | Tseng ......................... 365/149 |
| 5,789,267 | A |   | 8/1998  | Hsia et al. ................... 438/396 |
| 5,851,876 | A |   | 12/1998 | Jenq ............................ 438/253 |
| 5,891,772 | A | * | 4/1999  | Hsu ............................. 257/309 |
| 5,909,621 | A |   | 6/1999  | Hsia et al. ................... 438/254 |
| 6,222,722 | B1| * | 4/2001  | Fukuzumi et al. ........... 257/308 |

FOREIGN PATENT DOCUMENTS

GB          2 294 591 A       5/1996

\* cited by examiner

Primary Examiner—Richard Elms
Assistant Examiner—Christian D. Wilson
(74) Attorney, Agent, or Firm—Laurence A. Greenberg; Werner H. Stemer; Gregory L. Mayback

(57) ABSTRACT

A first capacitor electrode of the capacitor, which is arranged on a surface of a substrate (1), has a lower part (T) and a lateral part (S) arranged thereon. At least a first lateral area of the lateral part (S) is undulatory in such a way that it has bulges and indentations alternately which are formed along lines each running in a plane parallel to the surface of the substrate (1). The lateral part (T) can be produced by depositing conductive material in a depression (V) which is produced in a layer sequence whose layers are composed alternately of a first material and a second material and in which the first material is subjected to wet etching selectively with respect to the second material down to a first depth. The first capacitor electrode is provided with a capacitor dielectric (KD). A second capacitor electrode (P) adjoins the capacitor dielectric (KD).

5 Claims, 12 Drawing Sheets

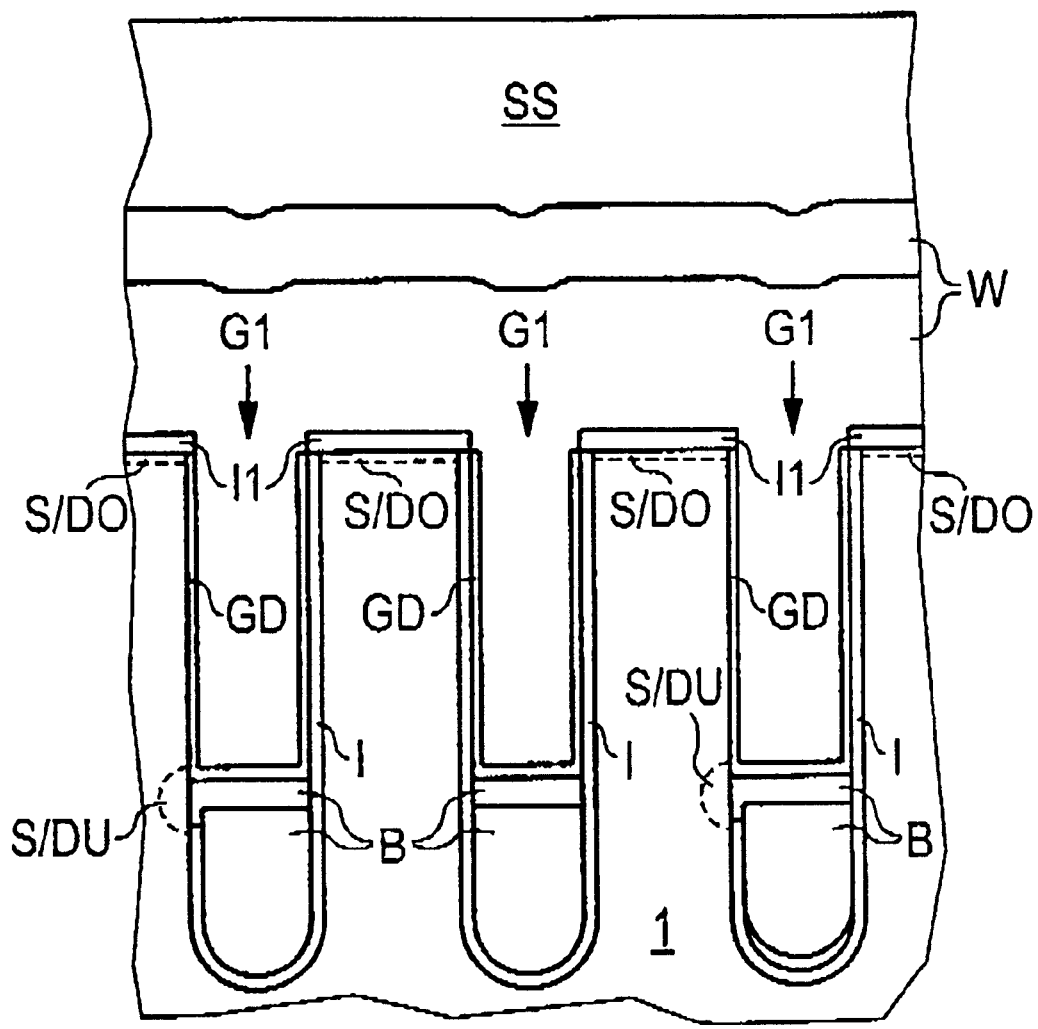

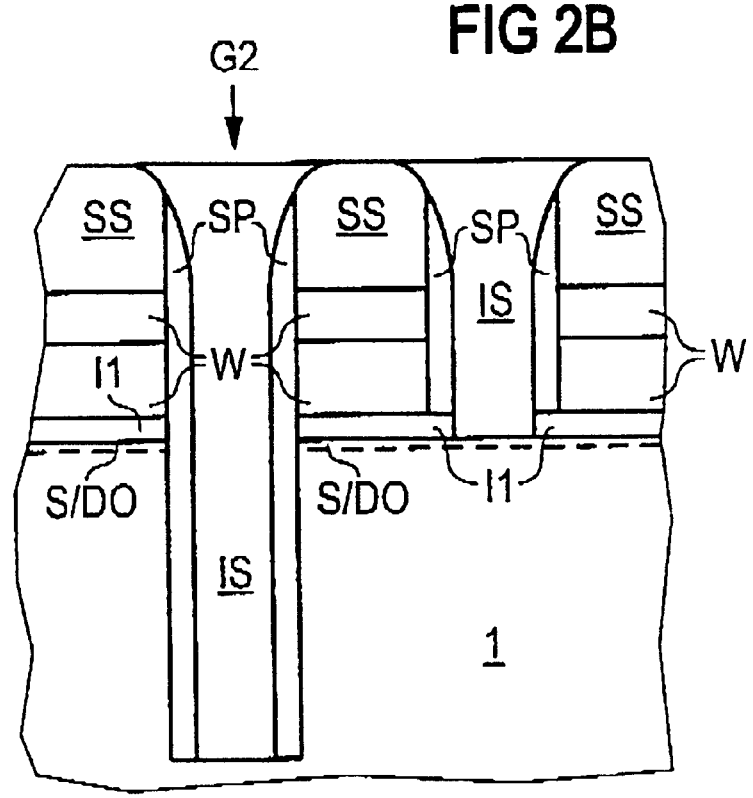
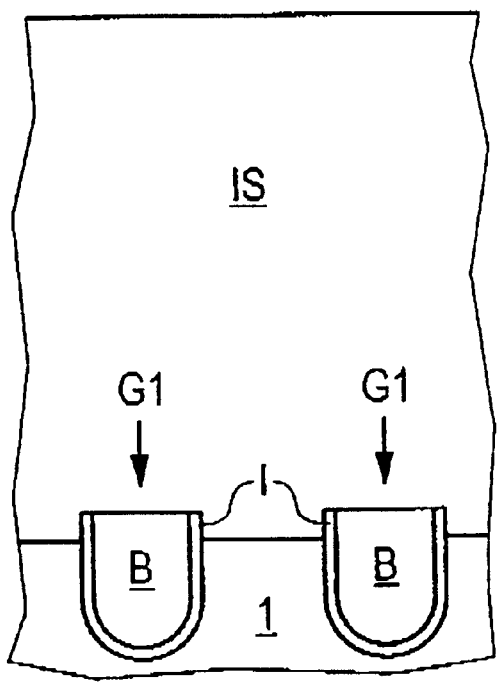

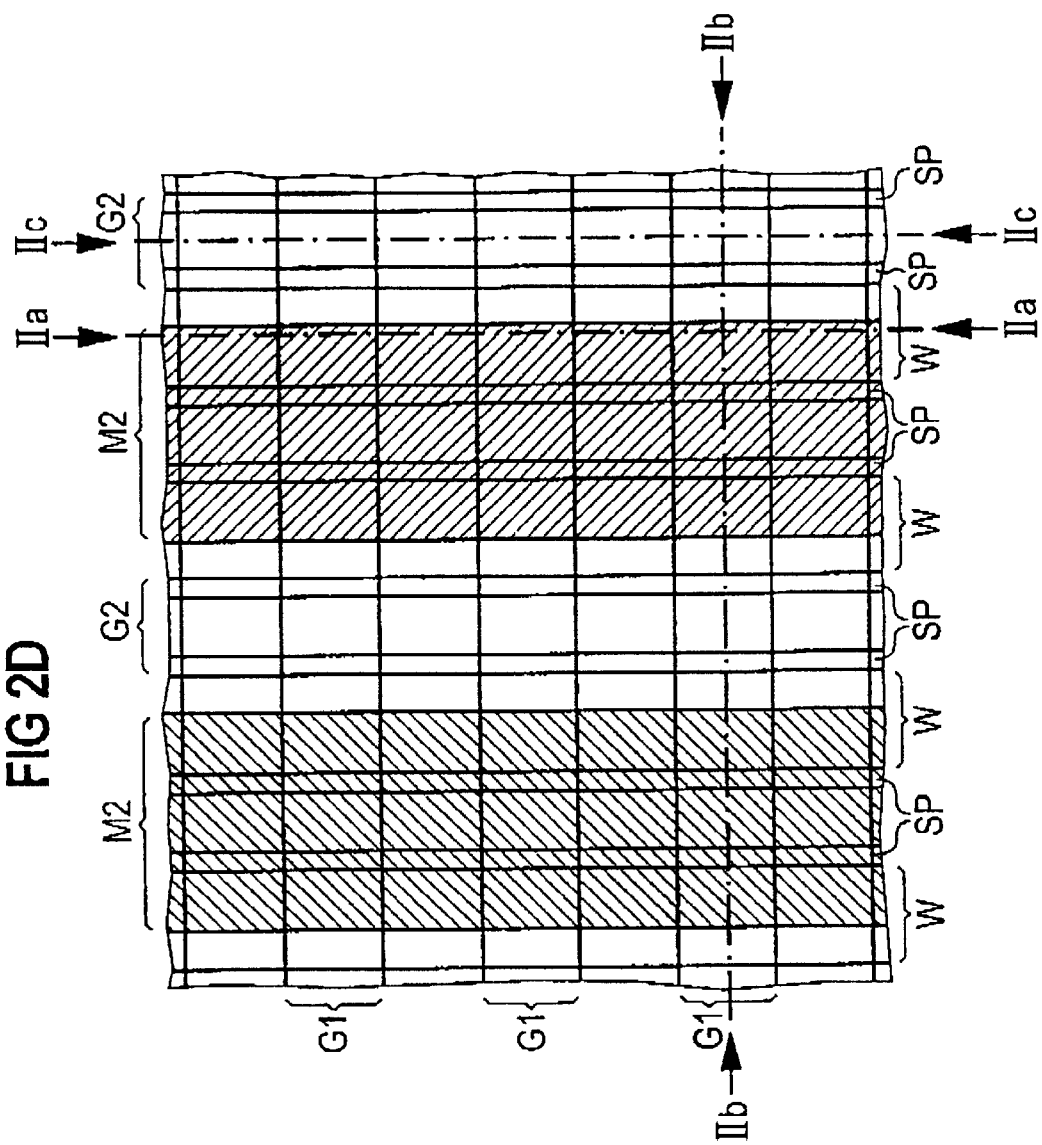

INTEGRATED CIRCUIT CONFIGURATION WITH AT LEAST ONE CAPACITOR AND METHOD FOR PRODUCING THE SAME

BACKGROUND OF THE INVENTION

Field of the Invention

The invention relates to an integrated circuit arrangement, that is to say a circuit arrangement which is arranged in a substrate, having at least one capacitor.

Such an integrated circuit arrangement is described in GB 2 294 591 A, for example. In order to produce the capacitor, first of all a layer made of amorphous silicon is deposited. A mask is produced above the latter, which mask comprises islands which are distributed on the layer made of amorphous silicon. The silicon is etched with the aid of the mask, so that the layer made of amorphous silicon obtains a roughened surface. The layer made of amorphous silicon is converted into a layer made of polysilicon by being heated, and serves as a first capacitor electrode of the capacitor. A capacitor dielectric is applied to the first capacitor electrode and a second capacitor electrode is applied to said dielectric.

SUMMARY OF THE INVENTION

The invention is based on the problem of specifying an integrated circuit arrangement having at least one capacitor which, in conjunction with a small space requirement and in comparison with the prior art, at the same time has a high capacitance. Furthermore, the intention is to specify a method for fabricating such an integrated circuit arrangement.

The problem is solved by means of an integrated circuit arrangement having at least one capacitor, in which the capacitor is arranged on a surface of a substrate. A first capacitor electrode of the capacitor has a lower part and a lateral part arranged on the lower part. The lateral part has a first lateral area and a second lateral area, which are opposite one another and whose distance from one another is smaller than a height of the lateral part. At least the first lateral area of the lateral part is undulatory, so that it has bulges and indentations alternately which are formed along lines each running in a plane parallel to the surface of the substrate. The lateral part and also at least an upper area of the lower part which is remote from the surface of the substrate are provided with a capacitor dielectric. A second capacitor electrode adjoins the capacitor dielectric.

On account of the first lateral area of the first capacitor electrode, in comparison with a capacitor whose first capacitor electrode essentially has only horizontal areas, the capacitor has a higher capacitance with the same space requirement.

The bulges and the indentations enlarge the first lateral area comparison with a planar lateral area, so that the pacitance of the capacitor is increased without enlarging e space required by the capacitor.

The bulges and indentations are preferably undulatory, so that he first lateral area has no edges at which local electric field increases can form, and, consequently, the capacitor has particularly low leakage currents.

A method for fabricating such an integrated circuit arrangement is specified below, which method likewise solves the problem.

A layer sequence whose layers are composed alternately of a first material and a second material is produced on a surface of a substrate. A depression is produced which cuts through the layer sequence. The first material is subsequently subjected to wet etching selectively with respect to the second material down to a first depth. Conductive material is deposited, so that a lateral part of a first capacitor electrode of the capacitor is produced on a side wall of the depression, which lateral part has at least one undulatory lateral area which faces the depression and has bulges and indentations alternately. Parts of the conductive material which are arranged outside the depression are removed. The layer sequence is subsequently removed. The lateral part and a lower part of the first capacitor electrode are produced in such a way that the lateral part is arranged on the lower part. The lateral and at least an upper area of the lower part which is remote from the surface of the substrate are provided with a capacitor dielectric. A second capacitor electrode is produced in a manner adjoining the capacitor dielectric.

Through the wet etching of the first material selectively with respect to the second material, the side wall of the depression is altered in such a way that it is undulatory and has bulges and indentations alternately. This form is transferred to the lateral part of the first capacitor electrode by depositing the conductive material on the side wall of the depression.

The bulges and indentations run along lines each running in a plane parallel to the surface of the substrate since the layers likewise run parallel to the surface of the substrate. Each of the layers defines an indentation or a bulge, respectively.

The deeper the first material is etched by wet etching, the more pronounced are the bulges and the indentations.

By way of example, n-doped polysilicon is suitable as the first material, and undoped polysilicon is suitable as the second material. In this case, $HNO_3+HF$, for example, is suitable as an etchant.

As an alternative, the first material may be composed of undoped polysilicon, while the second material is composed of p-doped polysilicon. In this case, choline, for example, is suitable as an etchant.

All materials which can be etched selectively with respect to one another are suitable as the first material and as the second material.

The use of polysilicon is particularly advantageous if the dopant concentration within the layers is varied gradually in the vertical direction. The consequence is that the same layer can be etched to different degrees. If the dopant concentration is set in such a way that the layers made of the first material can be etched less well in edge regions, that is to say in an upper and a lower region, then the indentations have a particularly soft profile in contrast to an edged profile.

A particularly high capacitance of the capacitor can be attained if the first capacitor electrode and/or the second capacitor electrode are composed of metal.

By way of example, the first capacitor electrode is composed of WN, platinum or ruthenium oxide. The second capacitor electrode is composed for example of TiN, tungsten or platinum.

A particularly high capacitance can be attained if the capacitor dielectric has a particularly high dielectric constant. Examples of suitable materials for the capacitor dielectric are $Ta_2O_5$, barium strontium titanate or aluminum oxide.

In order to simplify the process, it is advantageous if the lower part is produced at the same time as the lateral part. By way of example, the lower part is produced by depositing the conductive material during the production of the lateral part on the bottom of the depression. In this case, the first capacitor electrode comprises a single layer. A thickness of the lower part which is measured perpendicularly to the surface of the substrate essentially corresponds to a thickness of the lateral part which is equal to the distance between the two lateral areas. The lower part is disk-shaped. The lateral part is arranged along an edge of the lower part. Since the first lateral area faces the depression, the first lateral area points outward. The first capacitor electrode has the form of a cylinder open at the top. The first capacitor electrode is produced in the depression. In order to remove the parts of the conductive material which are arranged outside the depression, the depression may be filled with an auxiliary material. The auxiliary material serves as a mask during the etching of the conductive material, so that the conductive material is preserved in the depression.

As an alternative, the depression is produced around the first capacitor electrode to be produced. In this case, the lower part of the first capacitor electrode is produced under the layer sequence which is patterned by the depression. This can be done before the production or after the removal of the layer sequence. In this case, the first lateral area of the lateral part points inward.

By way of example, the layer sequence is produced on a conductive layer. During the production of the depression, the conductive layer is uncovered. The conductive material may subsequently be deposited. The conductive material outside the depression may be removed by being etched back, for example, so that the conductive layer is uncovered at the bottom of the depression. If the depression is intended to surround the first capacitor electrode, parts of the conductive layer which are arranged at the bottom of the depression are removed. If the first capacitor electrode is intended to be produced in the depression, the layer sequence is removed and then the parts of the conductive layer which are arranged under the layer sequence are removed. In both cases, the lower part of the first capacitor electrode is formed from the patterned conductive layer.

If the lateral part is produced after the lower part of the first capacitor electrode, then the lateral part may also be produced elsewhere than on the edge of the lower part. In particular, it is possible to produce a plurality of depressions per capacitor, so that the first capacitor electrode has a plurality of lateral parts. In order to obtain a particularly small space requirement for the capacitor, a mask can be used to produce the depressions, said mask being at least partly in spacer form, that is to say having small lateral dimensions.

A particularly high capacitance of the capacitor can be attained if the second lateral area of the lateral part also has indentations and bulges. To ensure that the form of the side wall of the depression is also transferred to the second lateral area during the deposition of the conductive material, the thicknesses of the layers of the layer sequence are greater than half the thickness of the deposited conductive material and/or the first depth down to which the first material is etched is less than half the thickness of the deposited conductive material.

As an alternative, only the first lateral area is undulatory.

The thicknesses of the layers are preferably between 10 and 30 nm. The thickness of the deposited conductive material, that is to say the distance between the two lateral areas of the lateral part of the first capacitor electrode, is preferably between 15 nm and 25 nm. The first material is preferably etched to a depth of between 10 nm and 30 nm.

The integrated circuit arrangement is a DRAM cell arrangement, for example.

By way of example, the lower part of the first capacitor electrode is connected to a transistor arranged underneath. At least the transistor and the capacitor form one of the memory cells. The memory cells are connected to word lines and bit lines running transversely with respect thereto.

By way of example, the DRAM cell arrangement is a one-transistor memory cell arrangement, in which each memory cell has a capacitor and a transistor connected thereto. In this case, the lower part of the first capacitor electrode is connected to a source/drain region of the transistor.

The connection is effected via a contact, for example. As an alternative, the lower part of the first capacitor electrode directly adjoins the source/drain region of the transistor.

An exemplary embodiment of the invention is explained in more detail below with reference to the figures.

BRIEF DESCRIPTION OF THE DRAWINGS

FIG. 2a shows the cross section from FIG. 1a after the auxiliary layer has been removed and upper parts of the bit lines, lower source/drain regions of transistors, a gate dielectric, word lines, a protective layer, spacers, second trenches, insulating structures and upper source/drain regions of the transistors have been produced.

FIG. 2b shows a cross section perpendicular to the cross section from FIG. 2a through the substrate after the process steps from FIG. 2a.

FIG. 2c shows a cross section parallel to the cross section from FIG. 2a along one of the second trenches after the process steps from FIG. 2a.

FIG. 2d shows the plan view from FIG. 1b in which the word lines, the first trenches, the second trenches, the spacers and a second mask are illustrated.

FIG. 4b shows a cross section parallel to the cross section from FIG. 4a through the substrate, this cross section running along one of the bit lines, after the process steps from FIG. 4a.

FIG. 5b shows the cross section from FIG. 4b after the process steps from FIG. 5a.

FIG. 5c shows a cross section parallel to the cross section from FIG. 5a through the substrate, this cross section running along a word line connection region, after the process steps from FIG. 5a.

FIG. 7b shows the cross section from FIG. 5b after the process steps from FIG. 7a.

FIG. 7c shows the cross section from FIG. 5c after the process steps from FIG. 7a.

The figures are not true to scale.

DESCRIPTION OF THE PREFERRED EMBODIMENT

In one exemplary embodiment, the starting material provided is a substrate 1 made of silicon which is p-doped in the region of a surface and has a dopant concentration of approximately $10^{16}$ cm$^{-3}$.

Figure 1A:
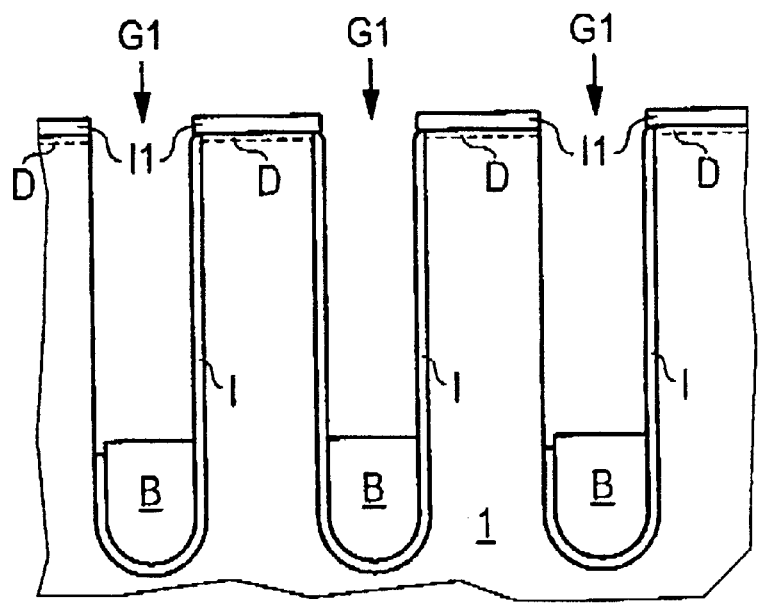
FIG. 1a shows a cross section through a substrate after a first insulating layer, an auxiliary layer, a doped region, first trenches, an insulation and lower parts of bit lines have been produced.

A first insulating layer Ii made of SiO$_2$ and having a thickness of approximately 30 nm is produced by thermal oxidation (see FIG. 1a).

A doped region D having a thickness of approximately 50 nm is produced by implantation with n-doping ions, which region adjoins the first insulating layer I1 and has a dopant concentration of approximately $10^{20}$ cm$^{-3}$ (see FIG. 1a)

An auxiliary layer (not illustrated) is produced by depositing silicon nitride to a thickness of approximately 100 nm.

First trenches G1 are produced in the substrate 1 by masked etching, said trenches running essentially parallel to one another and having a depth of approximately 500 nm (see FIG. 1a). The first trenches G1 have a width of approximately 100 nm and have a distance of approximately 100 nm between one another. CF$_4$+CHF$_3$, for example, is suitable as an etchant of the auxiliary layer and the first insulating layer I1. HBr, for example, is suitable as an etchant for the substrate 1. The auxiliary layer is subsequently removed again using hot phosphoric acid.

Thermal oxidation is carried out in order to produce an insulation I having a thickness of approximately 15 nm (see FIG. 1a).

In order to produce lower parts of bit lines B, tungsten nitride is deposited to a thickness of approximately 500 nm and is etched back by approximately 400 nm.

Figure 1B:
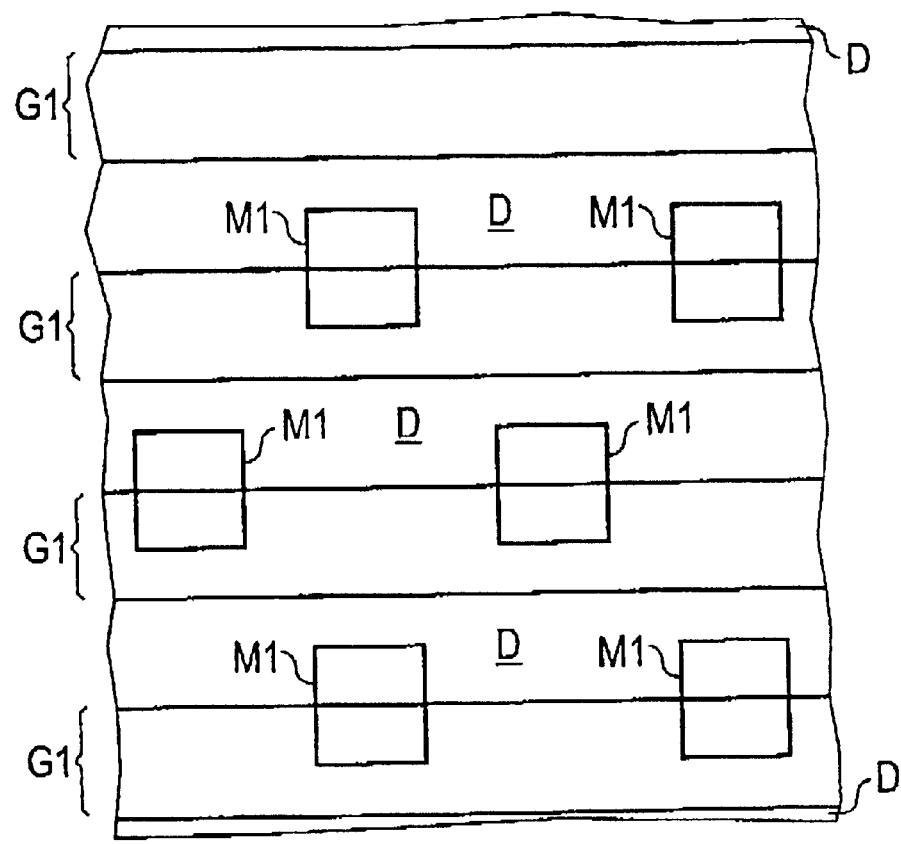
FIG. 1b shows a plan view of the substrate from FIG. 1a in which the first trenches, the doped regions and a first mask are illustrated.

Uncovered parts of the insulation I are removed with the aid of a first mask M1 made of photoresist, which does not cover square regions. The square regions overlap first side walls of the first trenches G1 (see FIG. 1b). The square regions have a side length of approximately 100 nm. Distances between square regions which are adjacent to one another along a bit line B are approximately 300 nm. The square regions which overlap the first side walls of mutually adjacent bit lines B are arranged offset with respect to one another, so that, in a projection perpendicular to the surface of the substrate 1 and parallel to the course of the bit lines B, a square region of one bit line B lies between two square regions of an adjacent bit line B. An outermost trench of the first trenches G1 is completely covered by the first mask M1 (see FIG. 1b). A strip-like word line connection region running parallel to the first trench G1 adjoins the outermost first trench G1.

The first mask M1 is subsequently removed.

A layer made of silicon nitride and having a thickness of approximately 1.5 nm is deposited (not illustrated).

In order to produce upper parts of the bit lines B, in-situ n-doped polysilicon is deposited to a thickness of approximately 500 nm and is etched back by approximately 330 nm using CF$_4$/SF$_6$, for example. In the case of the square regions not covered by the first mask M1, the bit lines B directly adjoin the substrate 1 (see FIG. 2a).

Thermal oxidation is carried out in order to produce a gate dielectric GD having a thickness of approximately 5 nm (see FIG. 2a).

During the thermal oxidation, dopant diffuses from the upper parts of the bit lines B into the adjoining substrate 1, where it forms lower source/drain regions S/DU of transistors (see FIG. 2a).

In order to produce word lines W, in-situ n-doped polysilicon is deposited to a thickness of approximately 100 nm and tungsten silicide is deposited above it to a thickness of approximately 50 nm (see FIGS. 2a, 2b and 2d).

In order to produce a protective layer SS, silicon nitride is deposited to a thickness of approximately 200 nm (see FIGS. 2a and 2b).

The protective layer SS, tungsten silicide and polysilicon are etched selectively with respect to SiO$_2$ by masked etching, so that parts of the gate dielectric GD which are arranged on the bit lines B and parts of the first insulating layer I1 are uncovered. The word lines W are thereby produced from the tungsten silicide and the polysilicon, said word lines running transversely with respect to the bit lines B and having protuberances which extend into the first trenches G1. The word lines W have a width of approximately 100 nm and have a distance of approximately 100 nm between one another. HCl+Cl$_2$, for example, is suitable as an etchant for tungsten silicide and polysilicon.

With the aid of a strip-like second mask M2 made of photoresist whose strip does not cover every second region arranged between two word lines W, SiO$_2$ and silicon are etched selectively with respect to silicon nitride and tungsten nitride. This produces second trenches G2 which run transversely with respect to the first trenches G1 and, in the region of the first trenches G1, extend only as far as the lower parts of the bit lines B, whereas they extend to a depth of approximately 420 nm outside the first trenches G1 (see FIGS. 2b, 2c and 2d). CHF$_3$+NF$_3$, for example, is suitable as an etchant.

An outermost trench of the second trenches G2 defines a bit line connection region.

The doped region D is patterned by the first trenches G1 and the second trenches G2. Upper source/drain regions S/DO of the transistors are thereby produced from the doped region D.

In order to produce spacers SP, silicon nitride is deposited to a thickness of approximately 20 nm and etched back. The second mask M2 is removed.

Insulating structures IS are produced between the word lines W by SiO$_2$ being deposited to a thickness of approximately 100 nm and being planarized by chemical mechanical polishing until the protective layer SS is uncovered (see FIGS. 2b and 2c).

Figure 3A:
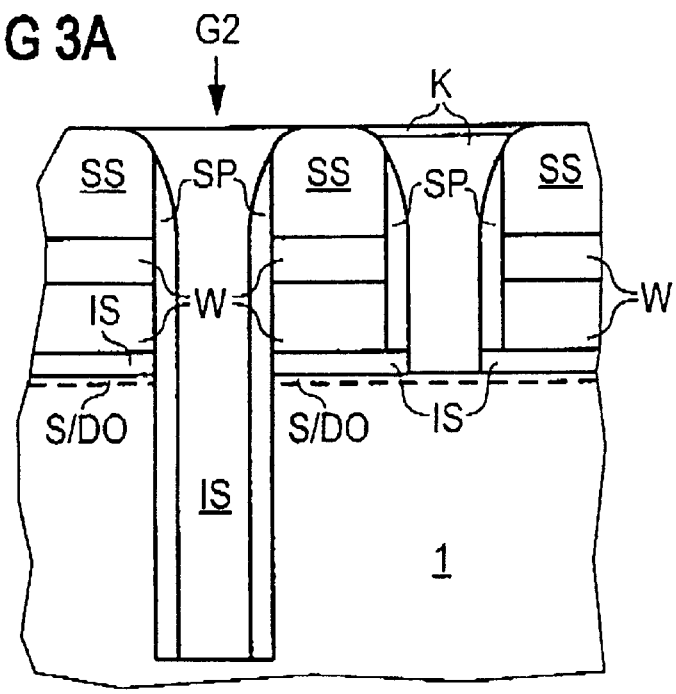
FIG. 3a shows the cross section from FIG. 2b after contacts have been produced.
Figure 3B:
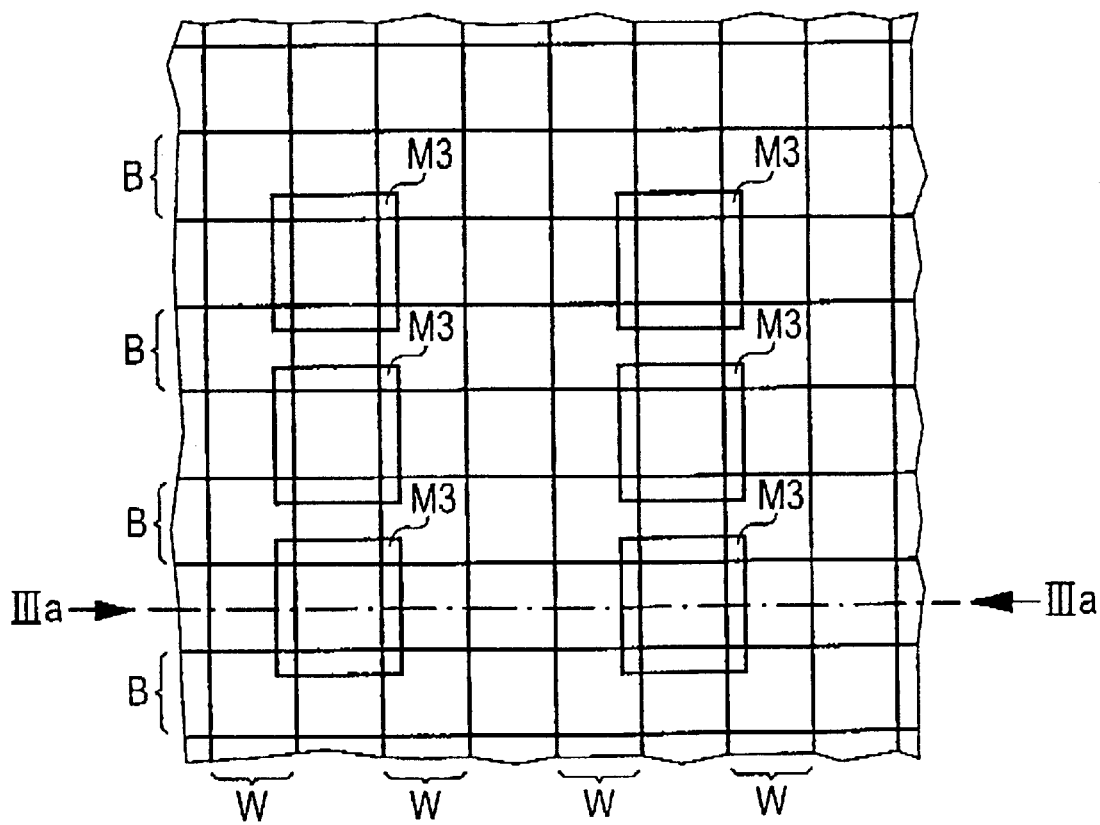
FIG. 3b shows the plan view from FIG. 2d in which the word lines, the bit lines and a third mask are illustrated.

With the aid of a third mask M3 made of photoresist which does not cover square regions which are arranged between the bit lines and the word lines and do not belong to the word line connection region, contact holes are opened to the upper source/drain regions S/DO (see FIG. 3a and FIG. 3b).

The contact holes are filled with contacts K by in-situ-doped polysilicon being deposited to a thickness of approximately 100 nm and being planarized by chemical mechanical polishing until the protective layer SF is uncovered.

Titanium is then applied to a thickness of approximately 10 nm by spluttering. By means of a heat-treatment step at 750° C. for approximately 20 seconds, regions made of titanium silicide and having a thickness of approximately 20 nm are formed over the deposited polysilicon. Residual titanium is removed by etching titanium using $NH_4OH+H_2O_2$, for example, so that the contacts K are produced from the polysilicon and from the titanium silicide.

A second heat-treatment step at approximately 870° C. for approximately 10 seconds follows in order to convert the titanium silicide into a low-resistance phase.

Figure 4A:
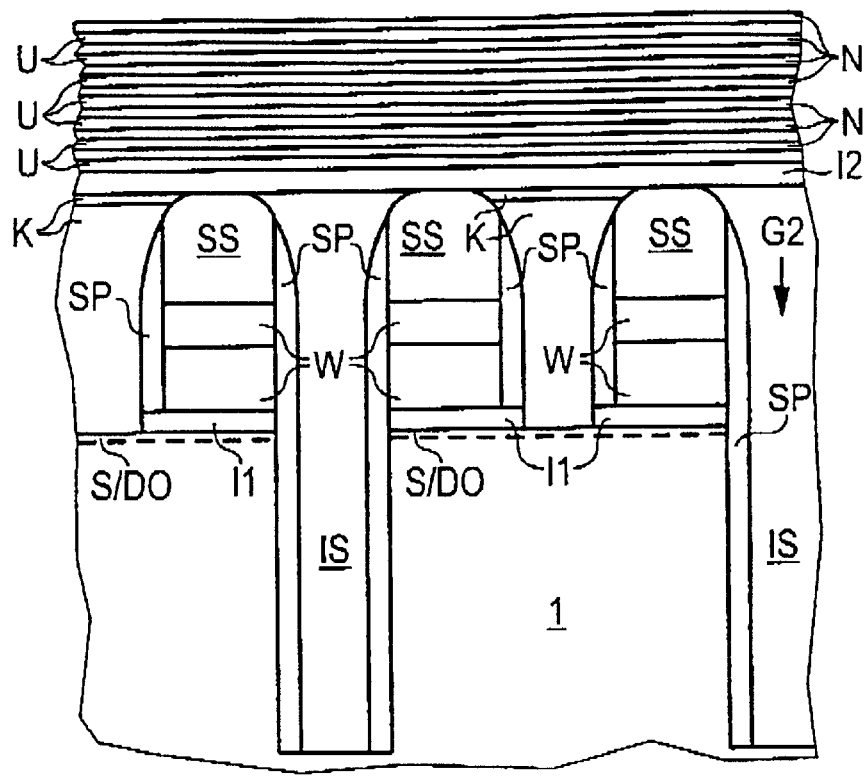
FIG. 4a shows the cross section from FIG. 3a after a second insulating layer, a layer sequence and further insulating structures have been produced.
Figure 4B:
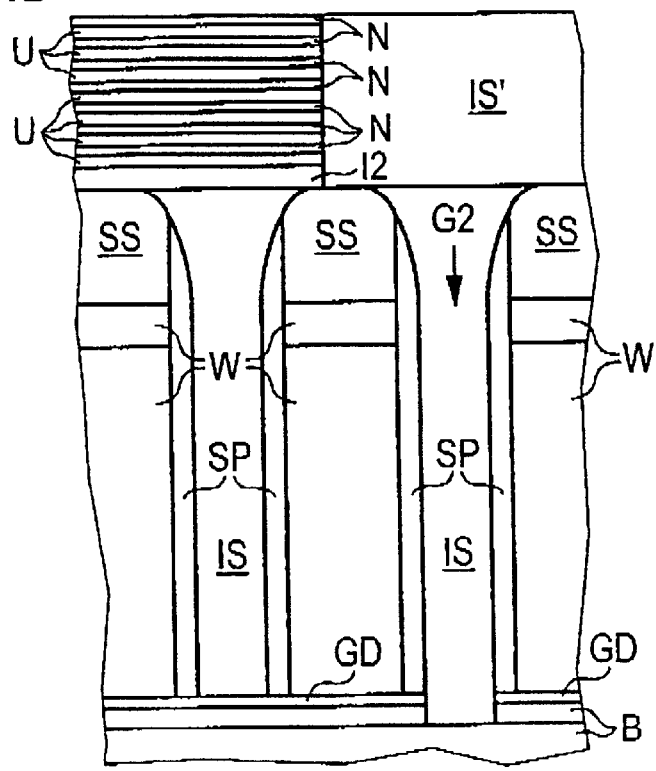

A second insulating layer I2 is produced by depositing $SiO_2$ to a thickness of approximately 30 nm (see FIGS. 4a and 4b).

A layer sequence is subsequently produced which contains alternately n-doped layers N and undoped layers U made of polysilicon each having a thickness of 20 nm. The number of layers N, U in the layer sequence is approximately 50. Only a few of the layers are depicted in the figures for the sake of better clarity. In the bit-line and word-line connection regions, the layer sequence is replaced by further insulating structures IS' made of $SiO_2$ by the corresponding parts of the layer sequence being removed and $SiO_2$ being deposited to a thickness of approximately 1000 nm and being planarized by chemical mechanical polishing until the layer sequence is uncovered (see FIG. 4b).

Figure 5A:
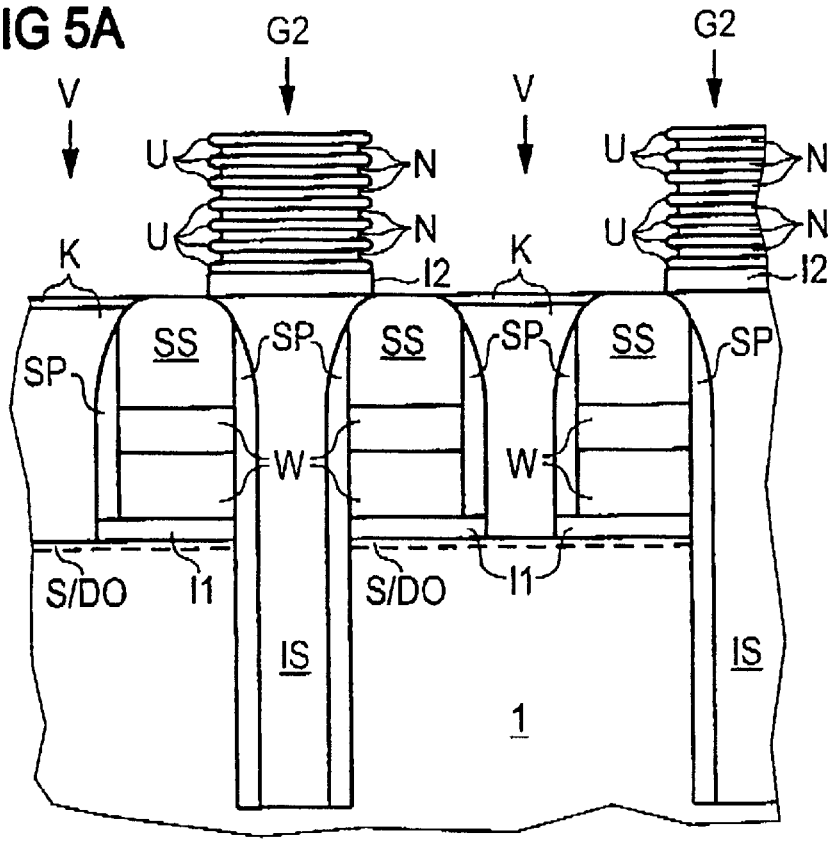
FIG. 5a shows the cross section from FIG. 4a after depressions and further depressions (illustrated in FIG. 5c) have been produced.
Figure 5B:
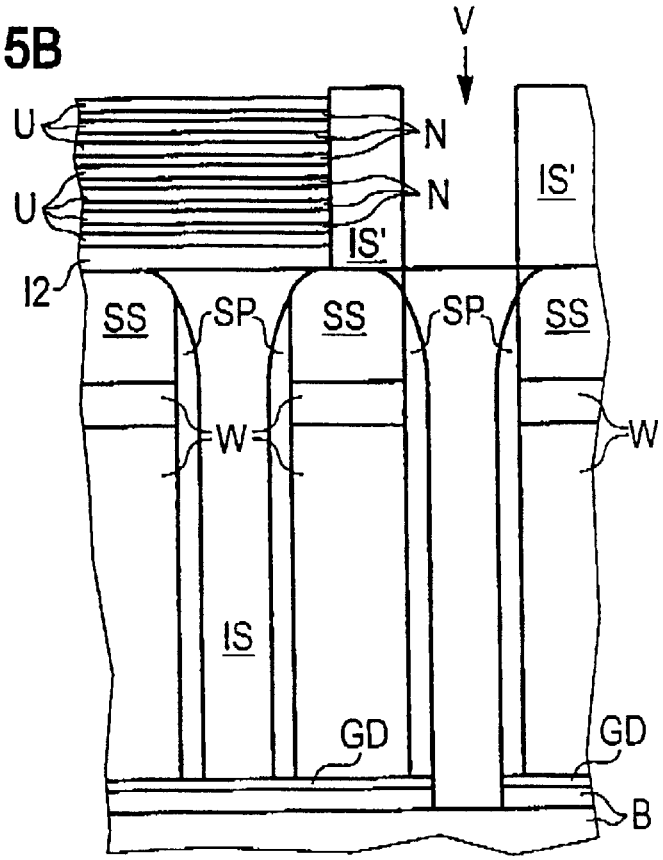
Figure 5C:
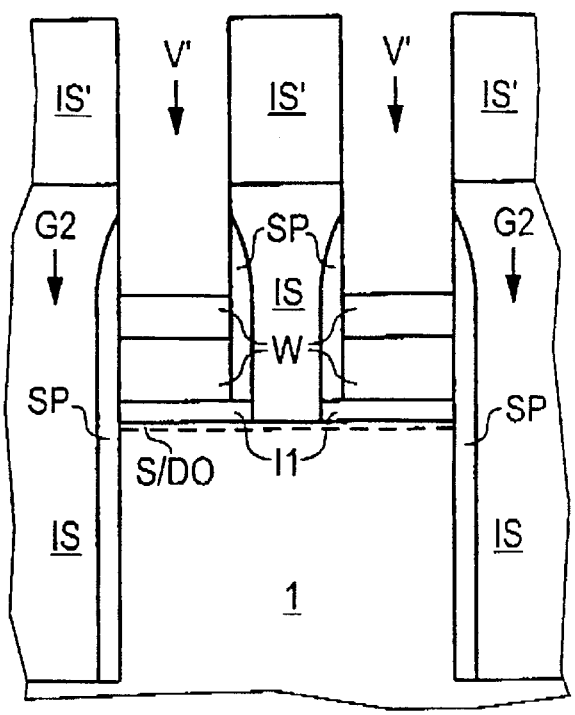
Figure 5D:
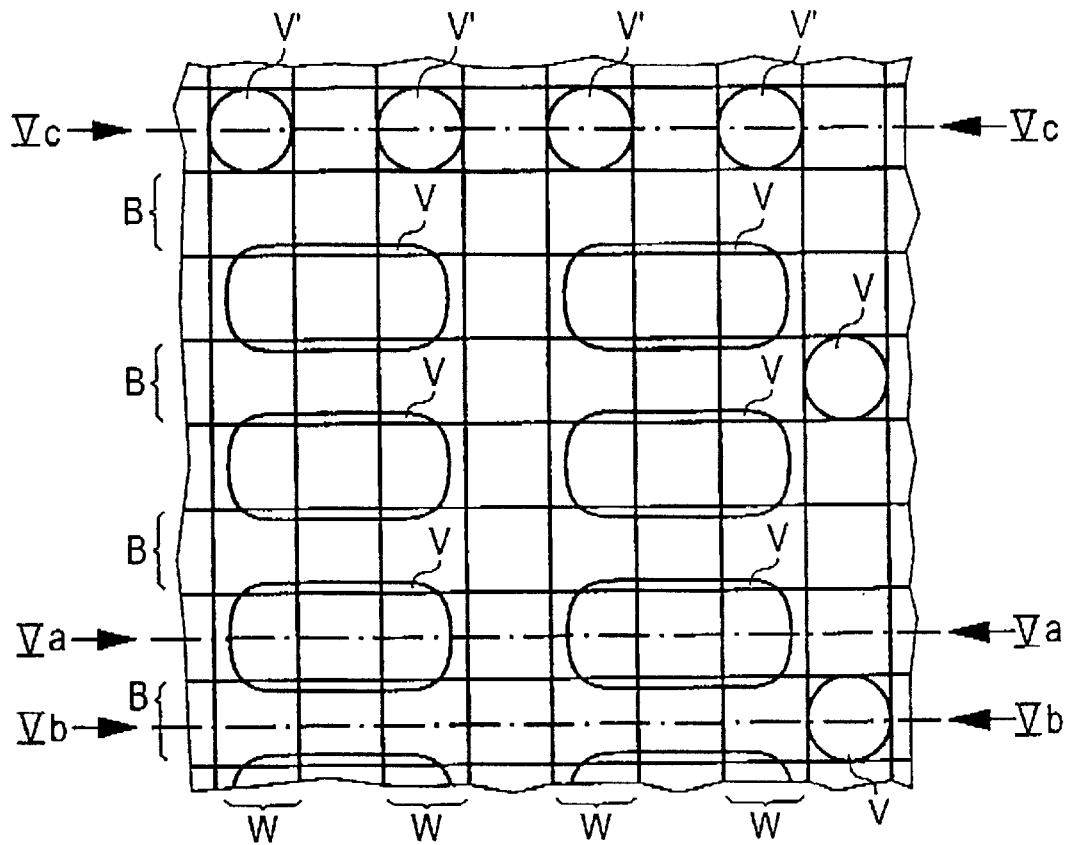
FIG. 5d shows the plan view from FIG. 3b after the process steps from FIG. 5a in which the word lines, the bit lines, the depressions and the further depressions are illustrated.

In order to produce depressions V, masked etching is performed to remove parts of the layer sequence and parts of the further insulating structures IS' in the bit line connection region (see FIGS. 5a, 5b and 5d). The depressions V in the region of the layer sequence are arranged above the contacts K and each have a width of approximately 100 nm and a length of approximately 300 nm.

Further depressions V' are produced by masked etching by the removal of parts of the further insulating structures IS' and parts of the protective layer SS in the word line connection region (see FIGS. 5c and 5d).

Doped silicon is subsequently subjected to wet etching selectively with respect to undoped silicon to a depth of approximately 20 nm using $HNO_3+HF$, for example, so that side walls of the depressions V become undulatory in the region of the layer sequence (see FIG. 5a).

Figure 6:
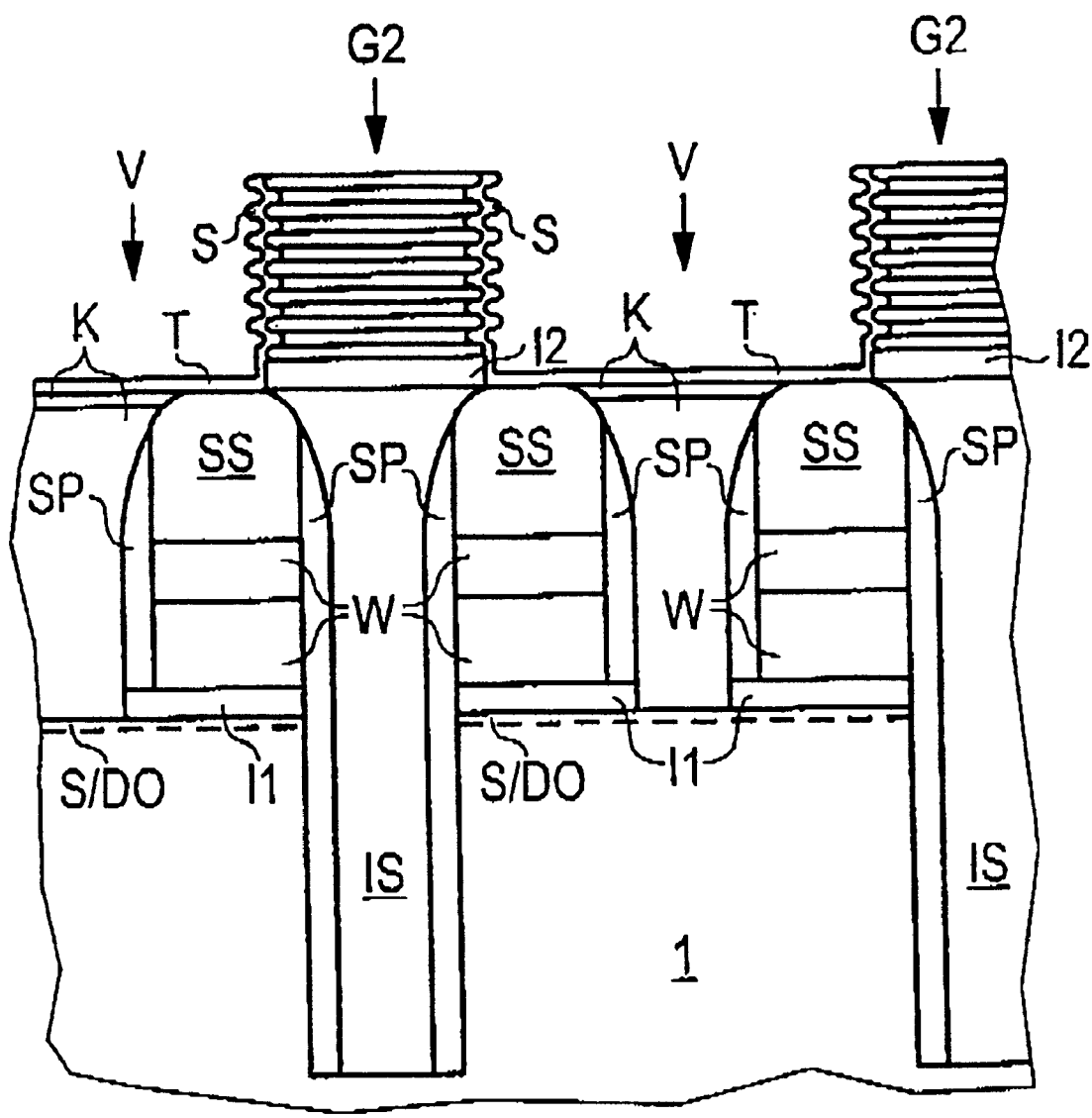
FIG. 6 shows the cross section from FIG. 5a after first capacitor electrodes of capacitors have been produced.

In order to produce first capacitor electrodes of capacitors, tungsten nitride is deposited to a thickness of approximately 20 nm. The depressions V and the further depressions V' are filled with photoresist. Tungsten nitride is subsequently removed by chemical mechanical polishing until an upper area of the layer sequence is uncovered (see FIG. 6). The first capacitor electrodes are produced from the tungsten nitride in the depressions V. The first capacitor electrodes each comprise a disk-shaped lower part T and a lateral part S arranged thereon. The lateral part S is arranged along an edge of the lower part T and has undulatory lateral areas (see FIG. 6). The photoresist is removed.

The layer sequence is subsequently removed by etching silicon selectively with respect to tungsten nitride and $SiO_2$ using $SF_6$, for example.

In order to produce a capacitor dielectric KD, $Ta_2O_5$ is deposited to a thickness of approximately 10 nm, so that the lateral parts S and the lower parts T of the first capacitor electrodes are provided with the capacitor dielectric KD. As part of a second capacitor electrode P, TiN is deposited to a thickness of approximately 10 nm.

With the aid of a third mask made of photoresist (not illustrated) which covers the first capacitor electrodes, TiN and $Ta_2O_5$ are subjected to wet etching and removed, so that the TiN and the $Ta_2O_5$ are removed in the depressions V and further depressions V' which are arranged in the word-line and bit-line connection regions.

The third mask is subsequently removed.

Tungsten is deposited to a thickness of approximately 100 nm, subjected to chemical mechanical polishing and patterned.

Figure 7A:
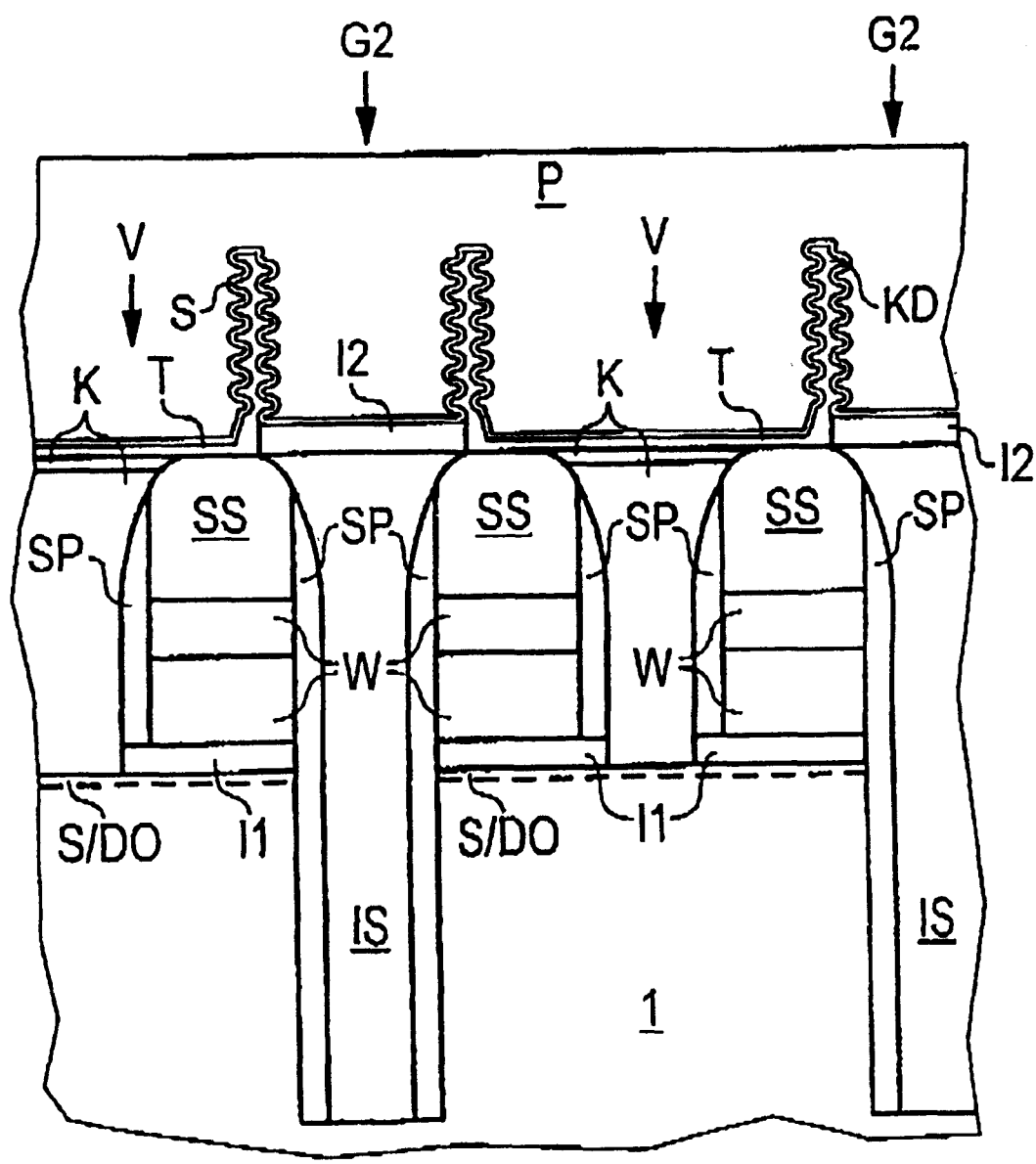
FIG. 7a shows the cross section from FIG. 6 after a capacitor dielectric, a second capacitor electrode, further bit lines and further word lines have been produced.

The second capacitor electrode P is produced in the region of the first capacitor electrodes from the tungsten and the TiN arranged underneath (see FIG. 7a). The second capacitor electrode P is a common capacitor electrode for all of the capacitors.

Figure 7B:
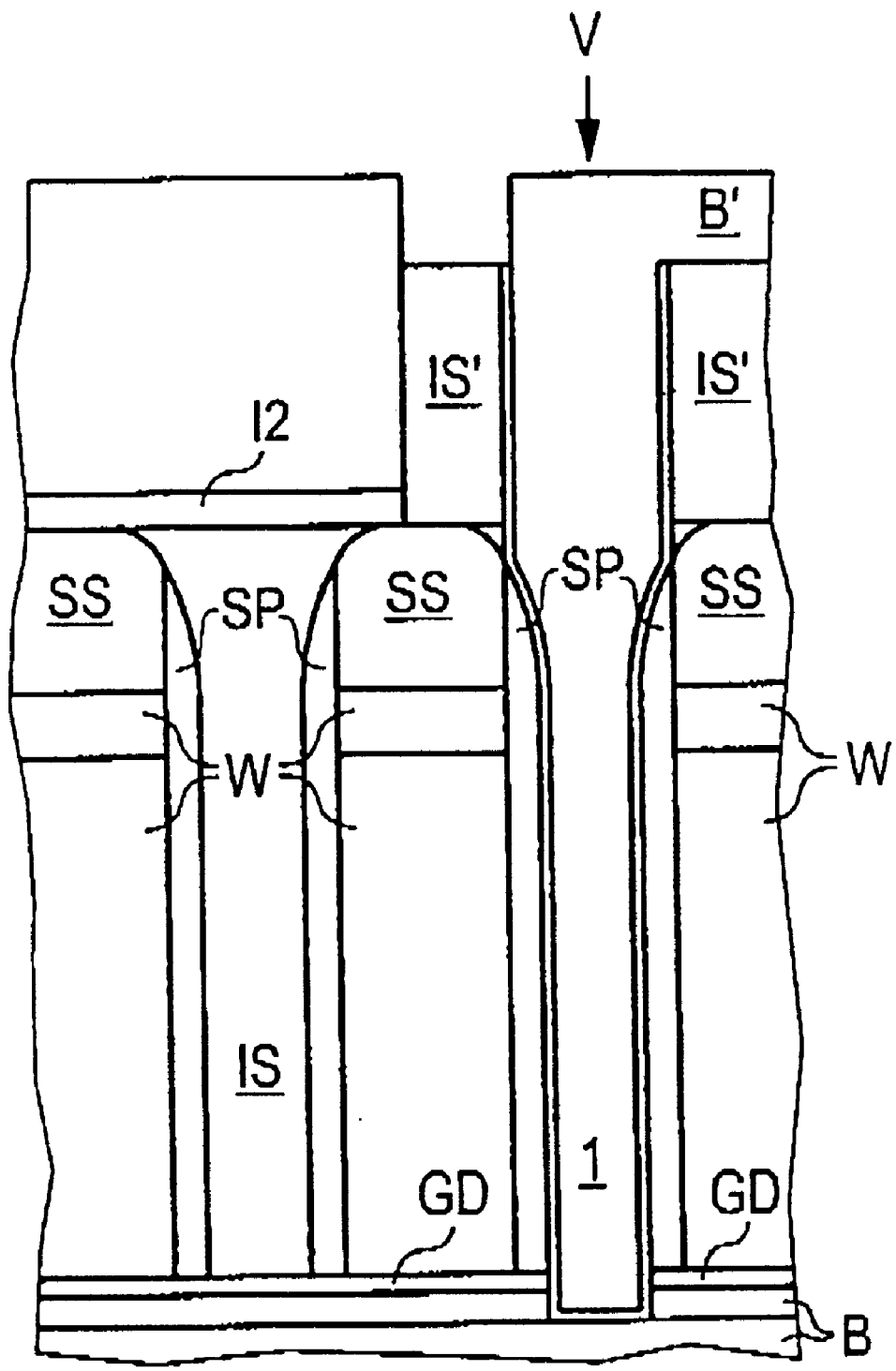
Figure 7C:
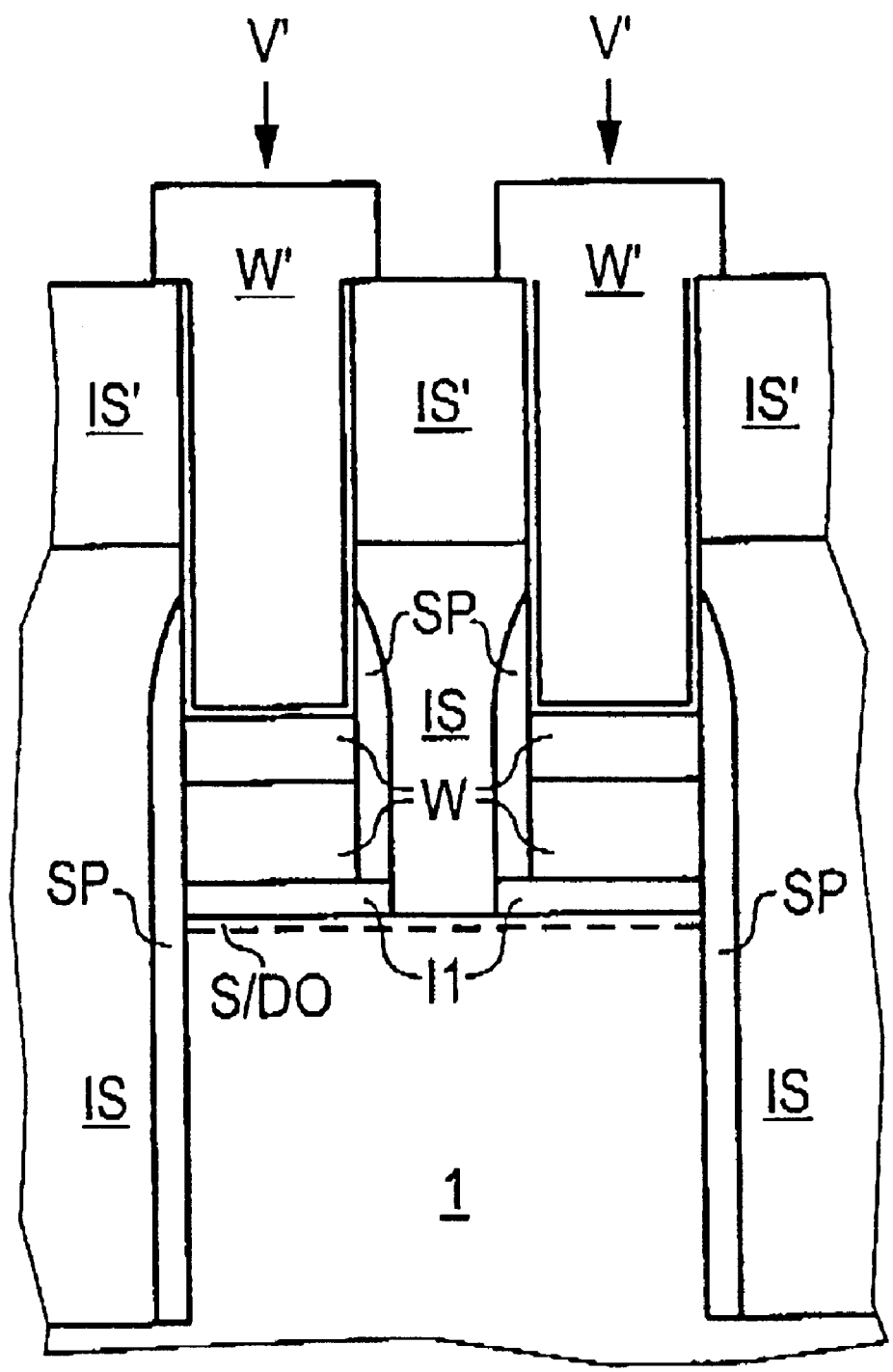

Lines W' leading to a periphery of the DRAM cell arrangement produced are produced from the tungsten in the word line connection region (see FIG. 7c). Lines B' leading to the periphery of the DRAM cell arrangement produced are produced in the bit line connection region (see FIG. 7b).

There are many conceivable variations of the exemplary embodiment which likewise lie within the scope of the invention. By way of example, dimensions of the above-described layers, regions, trenches, depressions and structures can be adapted to the respective requirements. The same applies to the choice of materials.

We claim:

1. An integrated circuit configuration having at least one capacitor and a selection transistor coupled thereto, comprising:

a substrate having a surface;

a capacitor disposed on said surface of said substrate, said capacitor including a first capacitor electrode having a lower part and a lateral part disposed on said lower part, said lower part having an upper area remote from said substrate;

a capacitor dielectric disposed on said lateral part and at least on said upper area of said lower part; and a second capacitor electrode adjoining said capacitor dielectric;

said lateral part having a height and a first lateral area, said lateral part having a second lateral area disposed opposite said first lateral area and spaced apart from said first lateral area by a distance smaller than said height of said lateral part;

at least said first lateral area of said lateral part being undulatory such that said first lateral area has alternating bulges and indentations formed along lines running in a plane parallel to said surface of said substrate;

a trench formed in said substrate, said trench having a lower part, a bit line running in said lower part of said trench, and a word line formed above said lower part of said trench; and a gate dielectric, a vertical transistor having a first and a second doped region disposed respectively in said substrate and said gate dielectric, said first doped region adjoining said bit line, said gate dielectric adjoining said word line, and a further doped region adjoining said lower part of said capacitor.

2. The integrated circuit configuration according to claim 1, wherein:

said lower part is disk-shaped and has an edge;

said lateral part is configured along said edge of said lower part; and said first lateral area of said lateral part points outward.

3. The integrated circuit configuration according to claim 2, wherein:

said second lateral area of said lateral part is undulatory such that said second lateral area has alternating bulges and indentations formed along lines running in a plane parallel to said surface of said substrate; and said indentations of said first lateral area are disposed opposite said bulges of said second lateral area.

4. The integrated circuit configuration according to claim 1, comprising:

a DRAM cell configuration having a plurality of memory cells, word lines, and bit lines running transversely to said word lines;

a transistor having a source/drain region configured underneath said lower part and connected to said lower part;

said transistor and said capacitor forming one of said plurality of said memory cells.

5. The integrated circuit configuration according to claim 1, wherein said bit line includes a metallic part and a doped silicon part and wherein said first doped region of said vertical transistor adjoins said doped silicon part.

* * * * *